(12) United States Patent
Martikainen

US007051835B2

(10) Patent No.: US 7,051,835 B2
(45) Date of Patent: May 30, 2006

(54) BASS-REFLEX LOUDSPEAKER SYSTEM AND METHOD OF MANUFACTURING THE SAME

(75) Inventor: Ilpo Martikainen, Mäntylahti (FI)

(73) Assignee: Genelec Oy, Iisalmi (FI)

( * ) Notice: Subject to any disclaimer, the term of this patent is extended or adjusted under 35 U.S.C. 154(b) by 44 days.

(21) Appl. No.: 10/468,437

(22) PCT Filed: Feb. 11, 2002

(86) PCT No.: PCT/FI02/00104

§ 371 (c)(1),
(2), (4) Date: Aug. 19, 2003

(87) PCT Pub. No.: WO02/074007

PCT Pub. Date: Sep. 19, 2002

(65) Prior Publication Data

US 2004/0104069 A1 Jun. 3, 2004

(30) Foreign Application Priority Data

Feb. 19, 2001 (FI) ................................ 20010313

(51) Int. Cl.
*H05K 5/02* (2006.01)
*A47B 81/06* (2006.01)
*H04R 1/28* (2006.01)
*H04R 1/34* (2006.01)

(52) U.S. Cl. ...................... 181/156; 181/153; 181/199; 381/349

(58) Field of Classification Search ................ 181/156, 181/155, 153, 148, 199, 193, 192, 194; 381/349, 381/350, 345; D14/204, 221, 224, 216, 210
See application file for complete search history.

(56) References Cited

U.S. PATENT DOCUMENTS 1,469,899 A * 10/1923 Donnell ...................... 181/193
1,888,769 A * 11/1932 Muench ...................... 181/193
2,160,166 A * 5/1939 Pausin ...................... 181/190
2,277,525 A * 3/1942 Mereurius ...................... 181/156
2,751,997 A * 6/1956 Gately, Jr. ...................... 181/152
2,866,513 A * 12/1958 White ...................... 181/156
3,687,221 A * 8/1972 Bonnard ...................... 181/191
3,730,291 A 5/1973 Goeckel ...................... 181/193
3,917,024 A * 11/1975 Kaiser, Jr. ...................... 181/155
3,923,124 A 12/1975 Hancock ...................... 181/156
4,592,444 A * 6/1986 Perrigo ...................... 181/199

(Continued)

FOREIGN PATENT DOCUMENTS

JP 52004817 A * 1/1977

(Continued)

*Primary Examiner*—Edgardo San Martin
(74) *Attorney, Agent, or Firm*—Birch, Stewart, Kolasch & Birch, LLP

(57) ABSTRACT

The loudspeaker construction comprises a loudspeaker chamber delimited by a loudspeaker enclosure structure, a reflex duct communicating with the loudspeaker chamber so as to connect the loudspeaker chamber to the exterior environment of the loudspeaker enclosure, and at least one loudspeaker unit mounted on the loudspeaker enclosure structure so as to form a portion of the delimiting walls of the loudspeaker chamber. According to the invention, the loudspeaker enclosure structure comprises a curved spiral structure closed from its both sides by gable elements so as to form the loudspeaker chamber, and the reflex duct is adapted at least partially running on the outer periphery of the spiral structure.

20 Claims, 1 Drawing Sheet

U.S. PATENT DOCUMENTS

| | | | | | |
|---|---|---|---|---|---|
| 4,987,564 | A | * | 1/1991 | Yokoyama | 181/160 |
| 5,751,827 | A | * | 5/1998 | Takahashi | 381/340 |
| 5,824,969 | A | * | 10/1998 | Takenaka | 181/156 |
| 6,078,676 | A | * | 6/2000 | Takenaka | 181/153 |
| 6,425,456 | B1 | * | 7/2002 | George | 181/199 |
| D480,066 | S | * | 9/2003 | Martikainen | D14/214 |
| D482,676 | S | * | 11/2003 | Martikainen | D14/215 |
| 6,648,098 | B1 | * | 11/2003 | Nichols | 181/193 |

FOREIGN PATENT DOCUMENTS

| | | | | |
|---|---|---|---|---|
| JP | 02202298 | A | * | 8/1990 |
| JP | 07222284 | A | * | 8/1995 |
| JP | 10108291 | A | * | 4/1998 |
| JP | 2000-78681 | A | | 3/2000 |
| JP | 2001-157286 | A | | 6/2001 |
| JP | 2002095077 | A | * | 3/2002 |
| JP | 2002271880 | A | * | 9/2002 |

* cited by examiner

BASS-REFLEX LOUDSPEAKER SYSTEM AND METHOD OF MANUFACTURING THE SAME

This application is the national phase under 35 U.S.C. § 371 of PCT International Application No. PCT/FI02/00104 which has an International filing date of Feb. 11, 2002, which designated the United States of America.

BACKGROUND OF THE INVENTION

1. Field of the Invention

The present invention relates to a bass-reflex loudspeaker structure. The invention also relates to a method for manufacturing a bass-reflex loudspeaker structure.

The invention is in particular suited for use in bass-range loudspeakers.

2. Description of Background Art

Among the requirements set for loudspeaker enclosures in the reproduction of low-frequency sounds, the most important factors are related to the capability of the enclosure to take internal pressure variations with deformations as small as possible (requiring stiffness) and the freedom of the enclosure from structural resonances. Generally, the enclosure is made from planar panels that are supported and stiffened from within the enclosure. As curved surfaces are structurally much stiffer than planar surfaces, also spherical, cylindrical and other equivalent shapes have been employed in the structures of loudspeaker enclosures.

One basic loudspeaker enclosure construction for reproduction of low-frequency sounds is the bass-reflex enclosure. Herein, the enclosure opening made for the loudspeaker unit is complemented with another opening that frequently has a duct connected thereto. Then, the air contained in the duct forms an acoustic impedance (a mass), while the air contained in the enclosure forms an acoustic capacitance (a spring), and the resonant frequency of this combination is dimensioned to cooperate with the loudspeaker unit. At the lowest frequencies, the combination exhibits a resonance, whereby the resonant circuit acts as a load to the loudspeaker unit. Then the excursion of the loudspeaker unit is small and the major portion of the radiation takes place via the reflex opening. When the goal is to reproduce sound in the very low-frequency range, the resonant frequency of the overall system must be lowered by way of either increasing the volume of the enclosure or the acoustic mass of air contained in the reflex duct. In many cases, a large size of the enclosure becomes a disadvantage that must be avoided, whereby the length of the reflex duct must be made long. Since the radiation occurring at the resonant frequency takes place via the reflex duct, the desired acoustical power output affects the flow velocity of air in the duct. If the flow velocity in the duct increases above a given limit value, the flow becomes turbulent thus evoking sound distortion and compression. Hence, the minimum cross section of the duct is determined by the desired acoustical power output. When a higher acoustical power is desired, the duct cross section area must be increased but the duct becomes longer consequently. A long duct cannot be fitted straight into an enclosure and a conventional approach has been to fold the duct in different angles, but abrupt bends cause turbulence even at small air flow velocities. The dimensioning of a bass-reflex loudspeaker and electrotechnical solutions to the problems thereof have been described widely in the literature of the art and, e.g., in European patent EP 0 322 686.

SUMMARY AND OBJECTS OF THE INVENTION

It is an object of the present invention to overcome the problems of the prior art and to provide an entirely novel type of bass-reflex loudspeaker construction and a method for manufacturing the same.

The goal of the invention is achieved by way of forming at least the reflex duct portion of the loudspeaker enclosure from a curved element having a spiraling shape in its, sectional plane and gable elements placed about its both sides. According to the invention, the reflex duct is composed so that outer shell of the curved portion forms at least a portion of the reflex duct wall, while the spiralingly "wrapped" extension of the duct outer shell forms the other wall of the reflex duct. In other words, the envelope of the loudspeaker enclosure and the reflex duct is in practice formed from a single banded structure that is bent into a spiral shape so that the reflex duct is created by the gap remaining between the coiled turns of the spiral. In an embodiment which is very typical to the invention, the reflex duct is formed by a channel whose width is equal to the width of the curved element and whose sides are delimited by the gable elements.

The invention offers significant benefits.

The structure becomes very stiff thus being free from disturbing resonances over the operational frequency range. The length of the reflex duct is maximized by locating it to the outer periphery of the enclosure, yet avoiding discontinuities even in a long reflex duct. Hence, the loudspeaker construction can be made very compact inasmuch the reflex duct portion can be located optimally. The construction is further optimized, thereby that the reflex duct serves as a portion of the load-bearing members of the loudspeaker construction. Turbulence is minimized due to the spiral, smoothly formed reflex duct, whereby also sound distortion and compression are reduced. Furthermore, a plurality of variations according to the invention can avail of very advantageous solutions in the sense of manufacturing technology, since the loudspeaker construction typically consists of only three major components in addition to the loudspeaker unit, or even less when using certain manufacturing technologies.

BRIEF DESCRIPTION OF THE DRAWINGS

In the following, the invention will be examined in greater detail with the help of exemplary embodiments by making reference to the appended drawings, in which.

DETAILED DESCRIPTION OF THE PREFERRED EMBODIMENTS

Figure 1:
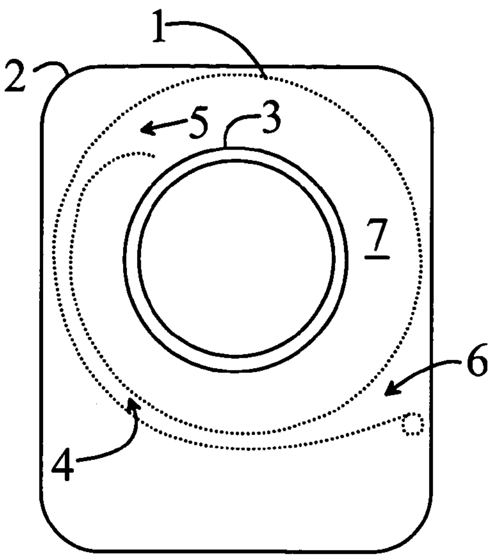
FIG. 1 shows a front view of a first embodiment of a bass-reflex loudspeaker construction according to the invention.

In the embodiment shown in FIG. 1, a loudspeaker unit 3 is mounted on a front wall 2. Behind the front wall 2 is shown by a dashed line the curved portion 1 of the loudspeaker enclosure that is implemented as a spiral structure.

To the interior of the spiral structure 1 is formed a loudspeaker chamber 7 wherefrom to the exterior of the loudspeaker is routed a reflex duct 4 that has a reflex duct inlet end 5 placed in the loudspeaker chamber 7 and a reflex duct outlet end 6 opening to the exterior. Due to flow technical reasons, the cross sections of both the inlet end 5 and the outlet end 6 are made larger than the cross section of the center portion of the reflex duct 4. The loudspeaker construction is designed for maximum stiffness with the exception of the active loudspeaker unit 3 that acts, as the acoustical generator of the system. The loudspeaker unit 3 itself serves as a delimiting portion of the loudspeaker chamber 7.

Figure 2:
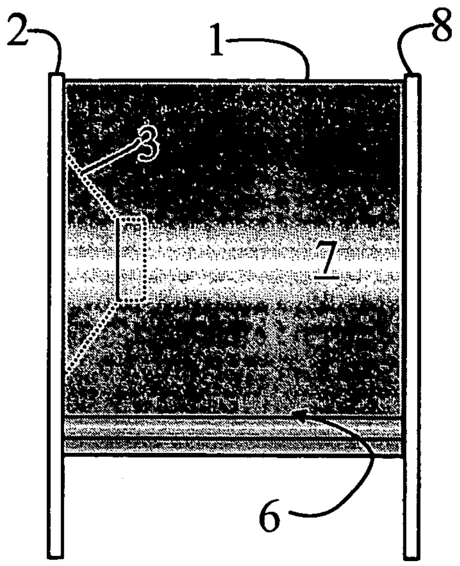
FIG. 2 shows the loudspeaker construction of FIG. 1 viewed from the right side.

As shown m FIG. 2, the loudspeaker chamber 7 is delimited by its spiral portion 1, its front wall panel 2, its rear wall panel 8, which enclose the spiraling duct from its both sides, and by the loudspeaker unit 3. In FIGS. 1 and 2 the reflex duct outlet opening 6 is drawn so as to exit to the right side, but according to the invention the reflex duct outlet opening can be made to exit in any direction. Further, while in the diagrams the reflex duct 4 is drawn spiraling in a counterclockwise direction when viewed from the side of the front wall panel 2, obviously the opposite direction (that is, clockwise) is also possible.

In the benefit of certain manufacturing technologies, the front wall panel 2 and the rear wall panel 8 are located parallel to each other and perpendicular to the longitudinal axis of the curved spiral portion 1, but this detail is obviously irrelevant to the function of the present invention. Loudspeaker constructions often aim to provide a spectacular look, it is thus possible, e.g., to enclose the curved spiral portion 1 with gable elements that may be inclined in any angle in regard to each other. Neither need the gable elements 2 and 8 be planar with the provision that the loudspeaker chamber 7 and the reflex duct 4 are manufactured into a non-leaking entity. Also the operating position of the loudspeaker unit may be chosen freely, e.g., so that the loudspeaker construction can be placed in a horizontal position resting on the gable element 8 or on suitable legs mounted to the gable element 2.

Figure 3:
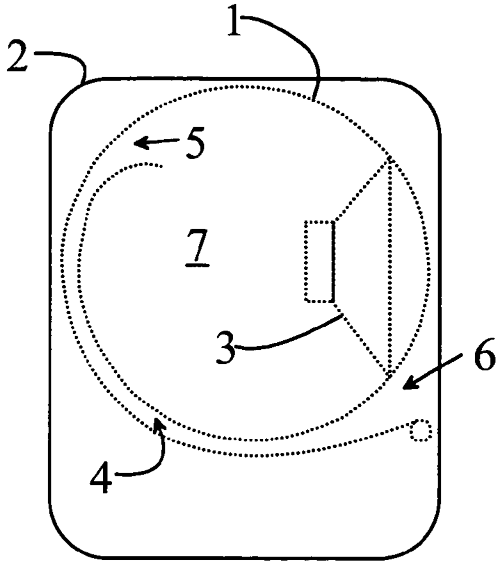
FIG. 3 shows a front view of a second embodiment of a bass-reflex loudspeaker construction according to the invention.
Figure 4:
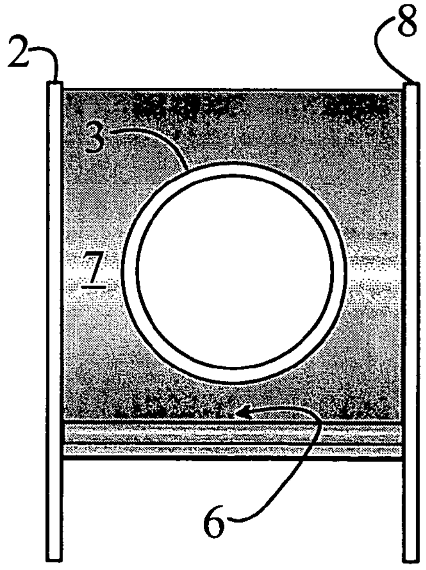
FIG. 4 shows the loudspeaker construction of FIG. 3 in a viewed from the right side.

The embodiment shown in FIGS. 3 and 4 is otherwise entirely equivalent with that of FIGS. 1 and 2 with the exception that herein the loudspeaker unit 3 is located on the curved spiral portion 1. Since the joint between the loudspeaker unit 3 and the curved wall portion 1 must naturally be air-tight, this mounting technique needs a seal member not shown in the diagrams between the loudspeaker unit 3 and the curved portion 1.

Using a known formula, the length of the reflex duct can be dimensioned on the basis of the volume of chamber 7 and the dimensions of the reflex duct:

$$f_r = c(S/lV)^{1/2}/2\pi$$

wherein $f_r$=resonant frequency c=speed of sound

S=cross-sectional area of reflex duct l=length of reflex duct

V=volume of loudspeaker chamber.

As an example of loudspeaker dimensioning on the basis of the above formula, the following dimensions are obtained for a loudspeaker enclosure such as those shown in FIGS. 1–4:

| | |
|---|---|
| Resonant frequency $f_r$ | 29 Hz |
| Diameter of curved portion 1 | 340 mm |
| Width of curved portion | 250 mm |
| Height of front (and rear) wall panel | 470 mm |
| Height of reflex duct 4 | 15 mm |
| Length of reflex duct | 580 mm |
| Volume of chamber 7 | 22 l |

Due to the spiral construction, the present invention is characterized in that the reflex duct 4 has a monotonously curved shape whose width is equal to the width of the curved portion 1. However, without departing from the scope and spirit of the invention, the width of the duct 4 may be reduced if so required, e.g., in the vicinity of the wall plates 2 and 8. While in the exemplary embodiments illustrated in the figures, the reflex duct 4 has a length substantially equal to half the perimeter of a circle, it is possible to allow the reflex duct length to vary within wide limits as dictated by the other design parameters (formula, diameter of loudspeaker unit, cutoff frequency of the loudspeaker unit and the like). Accordingly the reflex duct 4 may run even longer than a full circle about the outer perimeter of the curved portion 1 and its extension. In this special case, the reflex duct is not entirely placed along the outer perimeter of the curved portion 1.

Instead of having a cylindrically coiled wall, the curved portion 1 may also be conical.

When using casting, deep drawing or a similar technique, the curved portion may be formed from two mutually jointed parts, whereby the above-described division of the manufactured parts into a curved spiral part and its gable elements is not applicable. It may be further contemplated that the loudspeaker enclosure is designed to have a spherical shape, whereby it lacks any actual gable elements. Herein, while the joint between the manufactured parts may obviously be located in any place of the loudspeaker construction, the joint is typically made along the center plane of the piece.

The curved portion 1 can be made of a metal, plastic, cardboard or the like. Due to its curved shape even a very thin structure is stiff, and its resonant frequency is in the order of several hundred Hz, which is fully satisfactory in the reproduction of bass range sounds. By laminating the curved portion 1 from several layers of which at least one layer is lossy, it is possible to obtain a construction with the added benefit of attenuation of resonance frequencies. In this context, “lossy” has the meaning “causing appreciable loss or dissipation of energy”.

The loudspeaker construction shown in FIGS. 1–4 may be designed to be independent, to function as a so-called subwoofer optimized for the bass range only or, alternatively to serve as a component in a loudspeaker construction covering the sound frequency band.

Typically, the loudspeaker construction according to the invention can also incorporate an amplifier.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A bass-reflex loudspeaker construction comprising:

a loudspeaker chamber delimited by a loudspeaker enclosure structure, a reflex duct connected to the loudspeaker chamber which connects the loudspeaker chamber to a space outside the loudspeaker enclosure, the reflex duct having an inlet with a cross-section that is larger than a cross-section of a center portion of the reflex duct, and at least one loudspeaker unit mounted to the loudspeaker enclosure structure which forms a portion of the structure delimiting the loudspeaker chamber, wherein the loudspeaker enclosure structure comprises a curved spiral structure which is closed at both ends so as to form the loudspeaker chamber, and the reflex duct is formed at least partially on an outer periphery of the spiral structure.

2. The loudspeaker construction of claim 1, wherein the curved spiral structure is delimited at both ends thereof by gable elements.

3. The loudspeaker construction of claim 1, wherein the curved spiral structure is formed into a portion of a cast structure.

4. The loudspeaker construction of claim 1, wherein the reflex duct is disposed entirely on the outer periphery of the spiral structure.

5. The loudspeaker construction of claim 1, wherein the reflex duct has a width that is equal to a width of the spiral structure.

6. The loudspeaker construction of claim 2, wherein the gable elements are parallel.

7. The loudspeaker construction of claim 2, wherein the gable elements are perpendicular to a longitudinal axis of the spiral structure, and wherein the loudspeaker unit is sealed against a concave curved wall portion of the enclosure structure.

8. The loudspeaker construction of claim 1, wherein the spiral structure is fabricated of a laminated structure, and wherein at least one layer is a lossy layer, the lossy layer for attenuating resonance frequencies.

9. A method of constructing a bass-reflex loudspeaker construction comprising the steps of:

forming a loudspeaker chamber using a loudspeaker enclosure structure, connecting a reflex duct to the loudspeaker chamber for connecting the loudspeaker chamber to a space outside the loudspeaker enclosure, the reflex duct having an inlet with a cross-section that is larger than a cross-section of a center portion of the reflex duct, and mounting at least one loudspeaker unit on the loudspeaker enclosure structure for forming a portion of the construction delimiting the loudspeaker chamber, wherein the loudspeaker enclosure structure is formed of a curved spiral structure closed at both ends thereof so as to form the loudspeaker chamber, and the reflex duct is formed at least partially onto an outer periphery of the spiral structure.

10. The method of claim 9, further comprising the step of closing the curved spiral structure at both ends thereof by gable elements.

11. The method of claim 9, further comprising the step of forming the curved spiral structure into a portion of a cast structure.

12. The method of claim 9, further comprising the step of forming the reflex duct entirely onto the outer periphery of the spiral structure.

13. The method of claim 9, further comprising the step of arranging the reflex duct to have a width that is equal to a width of the spiral structure.

14. The method of claim 10, further comprising the step of placing the gable elements parallel to each other.

15. The method of claim 10, further comprising the steps of placing the gable elements perpendicularly to a longitudinal axis of the spiral structure, and sealing the loudspeaker unit against a concave curved wall portion of the enclosure structure.

16. The method of claim 9, further comprising the step of fabricating the spiral structure of a laminated structure wherein at least one layer is lossy, the lossy layer for attenuating resonance frequencies.

17. The loudspeaker construction of claim 1, wherein the reflex duct is formed of a smooth curve.

18. The method of claim 9, further comprising the step of forming the reflex duct in a smooth curved shape.

19. The loudspeaker construction of claim 1, wherein the loudspeaker enclosure is a conical coiled walled.

20. The method of claim 9, wherein the loudspeaker enclosure is a conical coiled walled.

* * * * *